United States Patent [19]
Wall

[11] 3,990,033
[45] Nov. 2, 1976

[54] ELECTRIC POWER CONTROLLER
[75] Inventor: Bill R. Wall, Bulverde, Tex.
[73] Assignee: Power Controls, Corporation (Entire), San Antonio, Tex.
[22] Filed: May 20, 1975
[21] Appl. No.: 579,255

[52] U.S. Cl. ............................. 338/200; 338/172; 338/174; 338/191; 338/198; 338/199
[51] Int. Cl.² .......................................... H01C 7/10
[58] Field of Search ........... 338/198, 199, 200, 191, 338/172, 174, 178, 175, 183; 200/6 C, 6 R, 66, 254

[56] References Cited
UNITED STATES PATENTS

| | | |
|---|---|---|
| 1,184,864 | 5/1916 | Monninger ...................... 338/200 X |
| 1,468,882 | 9/1923 | McKee et al. ................... 338/191 X |
| 1,526,634 | 2/1925 | Gottschalk ........................... 338/200 |
| 2,956,255 | 10/1960 | Maartmann-Moe ................ 338/172 |

*Primary Examiner*—C. L. Albritton

[57] ABSTRACT

Conductive and resistive tracks mounted on a circuit board are slidingly engaged by a bridging contact carried by the actuator arm of a controller that is operative to open or close switch contacts at the limit positions of its travel. The controller is pivotally supported in a non-conductive box within which the circuit board is releasably positioned. A manual control arm projects from the controller through a slot formed in a mounting plate covering the open end of the box.

16 Claims, 8 Drawing Figures

ELECTRIC POWER CONTROLLER

This invention relates to an electric power controller for electrical loads such as lamps, resistive elements and small electric motors.

Electric power controllers of the type wherein the resistance of a control circuit is varied by displacement of a control arm between limit positions at which switch devices are opened or closed, are well known as disclosed for example in U.S. Pat. Nos. 1,997,427, 2,073,849, 2,859,314 and 3,310,768. Such power controllers usually include parallel spaced tracks made of conductive and resistive material with which a bridging contact is in sliding engagement to vary the resistance of a power control circuit that is opened at one end of travel of the control arm through a normally closed switch device, the circuit resistance being shunted at the other end of travel by closing of a normally open switch device. The foregoing type of power controller generally requires the assemblage of several separate components to form a rather bulky package or must be constructed rather large in size. Such controllers are furthermore relatively expensive both as to cost of manufacture and installation. It is therefore an important object of the present invention to provide a power controller of the aforementioned type which is composed of parts and components that are well suited to economical mass production methods and easy assembly. A further object is to provide a power controller of such construction that it may be readily installed through use of commercially available hardware and of such size and shape as to appear similar to a common type of residential snap switch.

In accordance with the present invention, the conductive and resistive tracks as well as normally open and closed contact devices are mounted on a common circuit board that is removably positioned within a protective housing made of insulating material. The circuit board separates the interior of the housing into a chamber enclosing all of the power circuit components other than the tracks and contact devices which are exposed to the other chamber by the circuit board for engagement by the actuator arm of an integral controller member. The controller member also includes a pivot shaft rotatably supported by the walls of the housing and a manual control arm projecting through a slot in a mounting plate secured to and covering the opened end of the protective housing. The actuator arm carries a flexible bridging contact element for sliding engagement with the tracks and is provided with leading and trailing edges that are wedge-shaped for engagement with the contact devices. Detent formations on the actuator arm and the contact devices yieldably hold the controller in its limit positions at opposite ends of travel when in operative engagement with the contact devices. The controller is frictionally held in its intermediate positions by engagement of the bridging contact element with the tracks on the circuit board. These together with other objects and advantages which will become subsequently apparent reside in the details of construction and operation as more fully hereinafter described and claimed, reference being had to the accompanying drawings forming a part thereof, wherein like numerals refer to like parts throughout.

Figure 1:
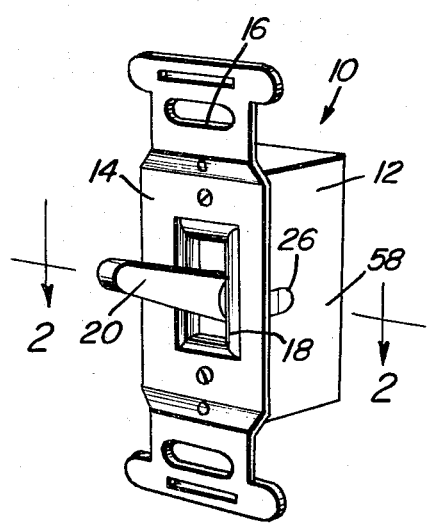
FIG. 1 is a perspective view showing a typical embodiment of an electric power controller constructed in accordance with the present invention.

Referring now to the drawings in detail, FIG. 1 illustrates a power controller constructed in accordance with one embodiment of the present invention, generally referred to by reference numeral 10. The components of the controller are protectively enclosed in a rectangular enclosure or housing 12 made of an electrically insulating material. The housing has an open end closed by a standard type of switch mounting strap 14 to which the housing is secured. The mounting strap with the housing projecting rearwardly therefrom is therefore adapted to be installed behind a standard switch wall plate (not shown) with the housing 12 received within a standard wall mounted switch or power receptacle box (not shown). The mounting strap 14 is accordingly provided with mounting slots 16 and a central slot receiving a centering insert and slot closure 18 through which a manual control lever arm 20 projects.

Figure 2:
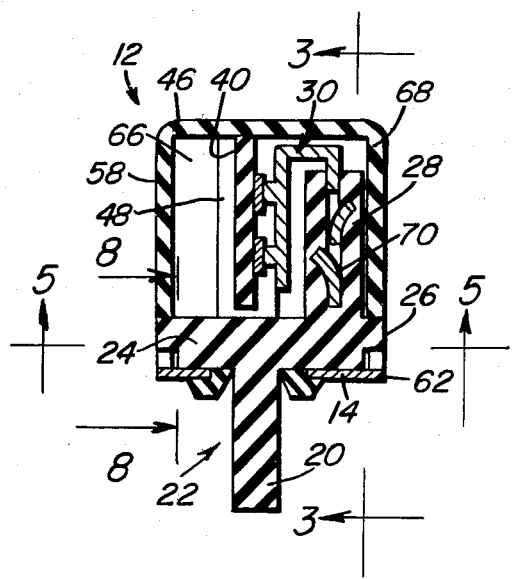
FIG. 2 is a top section view taken substantially through a plane indicated by section line 2—2 in FIG. 1.
Figure 3:
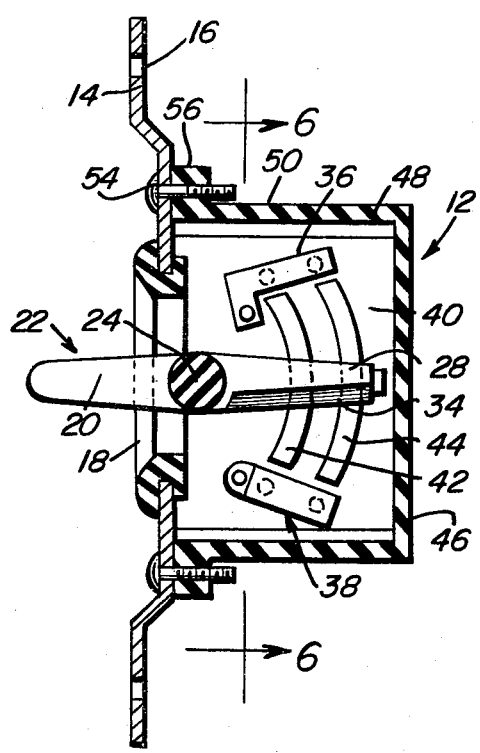
FIG. 3 is a side section view taken substantially through a plane indicated by section line 3—3 in FIG. 2.

As more clearly seen in FIGS. 2 and 3, the control arm forms part of an integral controller member generally denoted by reference numeral 22 made of an electrically non-conductive material and including an elongated pivot shaft 24 from which the control arm projects at a location centrally between semi-circular axial end portions 26. Also projecting from the pivot shaft in axial spaced relation to the control arm is an actuator arm 28. The actuator arm carries bridging contact element 30 and is formed with wedge-shaped edge formations 32 and 34 as more clearly seen in FIG. 6.

Figure 8:
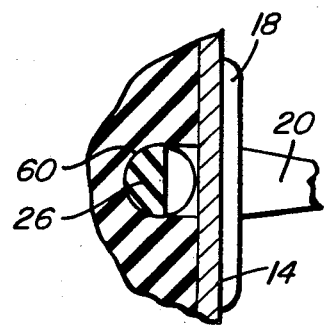
FIG. 8 is an enlarged partial sectional view taken substantially through a plane indicated by section line 8—8 in FIG. 2.
Figure 5:
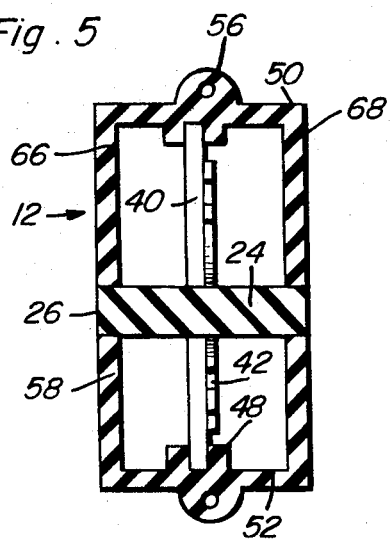
FIG. 5 is a section view taken substantially through a plane indicated by section line 5—5 in FIG. 2.
Figure 6:
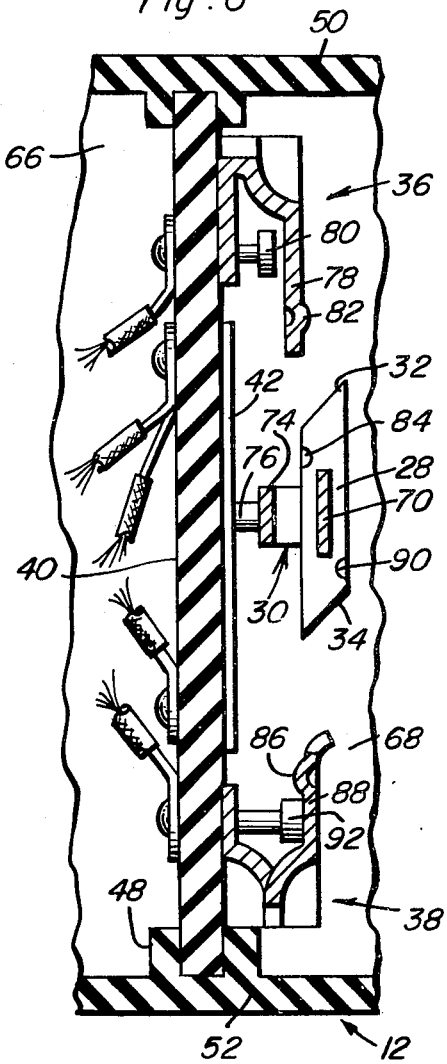
FIG. 6 is a partial section view taken substantially through a plane indicated by section line 6—6 in FIG. 3.

The wedge formations 32 and 34 on the actuator arm 28 are adapted to engage contact assemblies 36 and 38 mounted on a rectangular circuit board 40 together with a pair of parallel spaced arcuate tracks 42 and 44 slidingly engaged by the bridging contact element 30. The circuit board is held in abutment with back wall 46 of the housing by frictional gripping track formations 48 formed on the upper and lower walls 50 and 52 of the housing as more clearly seen in FIGS. 3 and 6. The circuit board when installed is spaced from the open end of the housing to which the plate 14 is secured by screws 54 threadedly received in formations 56 projecting externally from the upper and lower walls at the open end as shown in FIG. 3 or by some other type of fastening arrangement. The side walls 58 of the housing at the open end are formed with bearing recesses 60, as more clearly seen in FIG. 8, within which the pivot shaft 24 of the controller is seated. The pivot shaft is retained in the bearing recesses by the insert 18 in engagement therewith, as shown in FIG. 2. The pivot shaft is retained in place by the mounting strap 14. Thus, the pivot shaft establishes a pivotal axis for the controller member 22 that is fixed to the housing 12 and extends horizontally across the adjacent open end. The controller member may therefore be pivotally displaced about its pivot axis between limit positions by the control arm 20 in order to operate the controller through a power control circuit 64 depicted in FIG. 7, the components of which are enclosed within a chamber 66 on one side of the circuit board 40 as shown in FIG. 2. The circuit board separates chamber 66 from the other chamber 68 within which the actuator arm 28 is enclosed. As shown in FIGS. 3 and 6, the conductive and resistive strips forming the arcuate tracks 42 and 44 and the contact assemblies 36 and 38 are exposed to chamber 68 on one side of the circuit board and are connected by leads to the control circuit on the other side of the circuit board.

Figure 4:
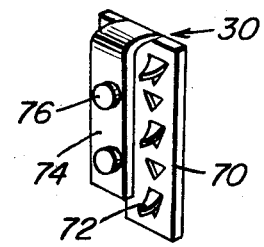
FIG. 4 is a perspective view of the bridging contact element associated with the power controller.
Figure 7:
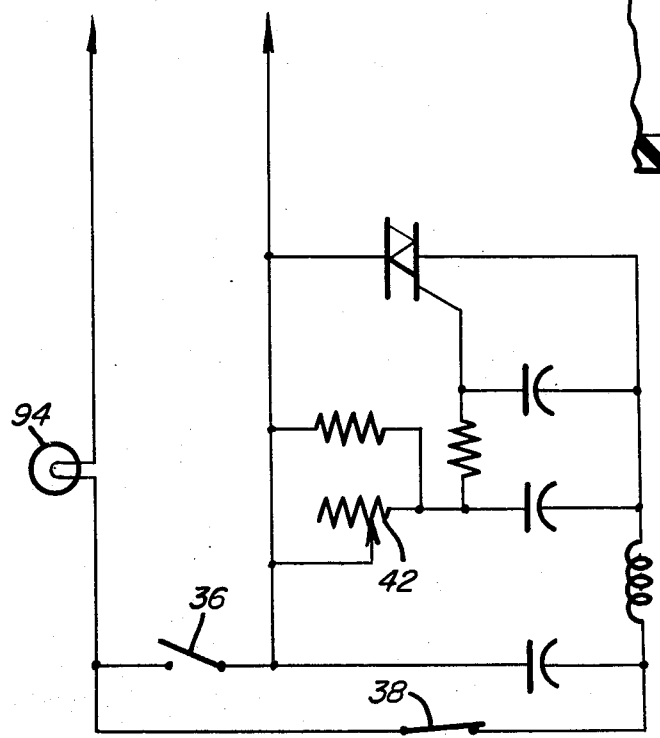
FIG. 7 is an electrical circuit diagram of a typical control circuit associated with the power controller.

The bridging contact element 30 as more clearly seen in FIG. 4, is made of an elastically deformable sheet metal that is electrically conductive. The element 30 is U-shaped having one leg 70 formed with struck-out barbs 72 so as to anchor the element within a slot formed in the actuator arm as shown in FIG. 2. The other leg 74 of element 30 is provided with a pair of contact formations 76 positioned in sliding contact with the arcuate tracks 42 and 44 in order to establish an adjusted value for the variable resistance of strip 44 in the control circuit 64 for the intermediate positions of the controller wherein the contact devices 36 and 38 are respectively held open and closed as shown in FIG. 7. At one end of travel of the actuator arm 28 corresponding to the maximum resistance of strip 42, the circuit is opened by opening of contact device 38 while at the other end of travel, the contact device 36 is closed by the actuator arm.

With reference to FIGS. 3 and 6, the normally opened contact device 36 anchored to the circuit board in spaced adjacency to the ends of arcuate strips 42 and 44, is provided with an elastically deformable contact arm 78 spaced from a pair of fixed contacts 80. At the end of travel of the actuator arm in one direction, the wedge-shaped edge 32 engages contact arm 78 to displace it into engagement with fixed contacts 80 to close the contact or switch device. The actuator arm is yieldably held in this limit position by a detent in the form of projection 82 formed on the contact arm 78 adapted to register with recess 84 formed in the actuator arm. Similarly a detent projection 86 formed on the deflectable contact arm 88 of switch contact device 38, is received in recess 90 formed in the actuator arm 28 to hold it in its other limit position. In the latter limit position, the actuator arm displaces the contact arm 88 out of engagement with a pair of fixed contacts 92 associated with the switch contact device 38. In the intermediate position, the controller member is frictionally held by the contact bias of element 30 against the track strips 42 and 44. The controller is thus able through the control circuit 64 as shown in FIG. 7 to adjust the circuit resistance regulating power supplied to load 94 as well as to either open the circuit through switch device 38 or shunt the circuit resistance through switch device 36 by displacement of the controller member to its opposite limit positions.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. In an electric circuit controller having a pair of spaced continuous tracks respectively made of conductive and resistive materials, an electrically conductive bridging contactor slidably engageable with said tracks and a pair of contact assemblies mounted adjacent opposite ends of the tracks in normally open and closed conditions respectively, the improvement including an enclosure having interconnected side walls forming an open end, a circuit board on which said tracks and contact assemblies are mounted, holder means fixed to the side walls for operatively positioning the circuit board within the enclosure, and a controller pivotally mounted in the enclosure having a non-conductive actuator arm positioned in parallel spaced relation to the circuit board and a control arm projecting from the open end of the enclosure, said actuator arm being engageable with the contact assemblies in opposite limit positions of the controller to respectively close the normally open contact assembly and open the normally closed contact assembly, means for carrying the bridging contactor on the actuator arm in sliding contact with the tracks and a mounting strap secured to the enclosure at the open end having means for retaining the controller in the enclosure and a slot through which the control arm extends.

2. The combination of claim 1 wherein said controller further includes an elongated pivot shaft from which the actuator and control arms project in opposite directions transversely of a rotational axis extending through the pivot shaft, said control arm being axially spaced from the actuator arm along said axis.

3. The combination of claim 2 wherein bearing surface formations are formed on said side walls at the open end of the enclosure receiving the elongated pivot shaft.

4. The combination of claim 3 including detent means for yieldably holding the actuator arm in the limit positions.

5. In an electric circuit controller having a pair of parallel spaced arcuate tracks respectively made of conductive and resistive materials, an electrically conductive bridging contactor slidably engageable with said tracks and a pair of contact assemblies mounted adjacent opposite ends of the tracks in normally open and closed conditions respectively, the improvement including an electrically non-conductive enclosure, a circuit board on which said tracks and contact assemblies are mounted, holder means for releasably positioning the circuit board within the enclosure, and a controller pivotally mounted in the enclosure having an actuator arm positioned in parallel spaced relation to the circuit board and a control arm projecting from the enclosure, said actuator arm being engageable with the contact assemblies at opposite limit positions of the controller to respectively close the normally open contact assembly and open the normally closed contact assembly, means for carrying the bridging contactor in sliding contact with the tracks, the enclosure including interconnected side walls forming an open end from which the control arm projects, the holder means being fixed to the side walls, and a mounting strap secured to the enclosure at the open end having means for retaining the controller in the enclosure and a slot through which the control arm extends.

6. The combination of claim 1 including detent means for yieldably holding the actuator arm in the limit positions.

7. In an electric circuit controller having a pair of parallel spaced arcuate tracks respectively made of conductive and resistive materials, an electrically conductive bridging contactor slidably engageable with said tracks and a pair of contact assemblies mounted adjacent opposite ends of the tracks in normally open and closed conditions respectively, the improvement including an electrically non-conductive enclosure, a circuit board on which said tracks and contact assemblies are mounted, holder means for releasably positioning the circuit board within the enclosure, and a controller pivotally mounted in the enclosure having an actuator arm positioned in parallel spaced relation to the circuit board and a control arm projecting from the enclosure, said actuator arm being engageable with the contact assemblies at opposite limit positions of the controller to respectively close the normally open contact assembly and open the normally closed contact assembly, and means for carrying the bridging contactor in sliding contact with the tracks, said actuator arm being formed with wedge-shaped edges engageable with the contact assemblies.

8. In an electric circuit controller having a pair of parallel spaced arcuate tracks respectively made of conductive and resistive materials, an electrically conductive bridging contactor slidably engageable with said tracks and a pair of contact assemblies mounted adjacent opposite ends of the tracks in normally open and closed conditions respectively, the improvement including an electrically non-conductive enclosure, a circuit board on which said tracks and contact assemblies are mounted, holder means for releasably positioning the circuit board within the enclosure, and a controller pivotally mounted in the enclosure having an actuator arm positioned in parallel spaced relation to the circuit board and a control arm projecting from the enclosure, said actuator arm being engageable with the contact assemblies at opposite limit positions of the controller to respectively close the normally open contact assembly and open the normally closed contact assembly, means for carrying the bridging contactor in sliding contact with the tracks, said bridging contactor comprising a U-shaped element made of elastically deformable sheet material having an anchoring leg embedded in the actuator arm and a track engaging leg spaced from the actuator arm.

9. The combination of claim 6 wherein each of said contact assemblies includes a pair of contact elements fixed to the circuit board and an elastically deflectable contact arm engageable by the actuator arm of the controller to engage or disengage the contact elements.

10. The combination of claim 9 wherein said detent means includes a recess and a projection respectively formed on the actuator and contact arms and engageable with each other in the limit position of the controller.

11. In an electric circuit controller having a pair of parallel spaced arcuate tracks respectively made of conductive and resistive materials, an electrically conductive bridging contactor slidably engageable with said tracks and a pair of contact assemblies mounted adjacent opposite ends of the tracks in normally open and closed conditions respectively, the improvement including an electrically non-conductive enclosure, a circuit board on which said tracks and contact assemblies are mounted, holder means for releasably positioning the circuit board within the enclosure, and a controller pivotally mounted in the enclosure having an actuator arm positioned in parallel spaced relation to the circuit board and a control arm projecting from the enclosure, said actuator arm being engageable with the contact assemblies at opposite limit positions of the controller to respectively close the normally open contact assembly and open the normally closed contact assembly, means for carrying the bridging contactor in sliding contact with the tracks, each of said contact assemblies including a pair of contact elements fixed to the circuit board and an elastically deflectable contact arm engageable by the actuator arm of the controller to engage or disengage the contact elements.

12. The combination of claim 11 wherein said actuator arm is formed with wedge-shaped edges engageable with the contact assemblies.

13. The combination of claim 1 including a power control circuit to which said tracks and contact assemblies are connected, said enclosure being partitioned by the circuit board into a pair of chambers, the control circuit being enclosed in one of the chambers while the tracks and the contact assemblies are exposed by the circuit board to the other of the chambers within which the actuator arm is enclosed.

14. The combination of claim 5 wherein said retaining means includes a centering insert framing the slot in the mounting strap and holding the controller in pivotal relation to the enclosure.

15. The combination of claim 1 wherein said retaining means includes a centering insert framing the slot in the mounting strap and holding the controller in pivotal relation to the enclosure.

16. In combination with a power control circuit, a controller having a pair of spaced tracks connected to said circuit and respectively made of conductive and resistive materials, circuit opening and closing contact means connected to said circuit and a contactor selectively displaceable between opposite limit positions in continuous slideable engagement with said tracks, the improvement including a circuit board on which the circuit, the tracks and the contact means are mounted, an enclosure having holder means for positioning the circuit board in operative relation to the contactor, a controller lever having a control arm projecting from the enclosure and a non-conductive actuator arm on which the contactor is mounted, said actuator arm being engageable with the contact means at the opposite limit positions of the contactor to respectively open and close the circuit, a mounting strap secured to the enclosure having a slot through which the control arm projects externally of the enclosure, and insert means received in said slot of the mounting strap for retaining the lever centered in said slot in pivotal relation to the enclosure.

* * * * *